US006976863B2

(12) United States Patent
Sato

(10) Patent No.: US 6,976,863 B2
(45) Date of Patent: Dec. 20, 2005

(54) SEMICONDUCTOR DEVICE SOCKET

(75) Inventor: Masaru Sato, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 11/013,800

(22) Filed: Dec. 17, 2004

(65) Prior Publication Data

US 2005/0136721 A1 Jun. 23, 2005

(30) Foreign Application Priority Data

Dec. 19, 2003 (JP) .............................. 2003-423833

(51) Int. Cl.[7] .......................................... H01R 11/22
(52) U.S. Cl. ..................................... 439/266; 439/331
(58) Field of Search ............................... 439/331, 268, 439/266, 264, 265, 263

(56) References Cited

U.S. PATENT DOCUMENTS

| 5,556,293 | A | * | 9/1996 | Pfaff | 439/266 |
| 5,611,705 | A | * | 3/1997 | Pfaff | 439/266 |
| 5,800,205 | A |   | 9/1998 | Arakawa | |
| 6,027,355 | A | * | 2/2000 | Ikeya | 439/268 |
| 6,149,449 | A |   | 11/2000 | Abe | |
| 6,261,114 | B1 | * | 7/2001 | Shimada | 439/266 |
| 6,609,923 | B2 | * | 8/2003 | Sato et al. | 439/259 |
| 6,655,974 | B2 | * | 12/2003 | Nakano et al. | 439/259 |
| 6,776,643 | B2 | * | 8/2004 | Nakano | 439/342 |
| 6,793,512 | B2 | * | 9/2004 | Abe et al. | 439/268 |
| 6,796,823 | B1 | * | 9/2004 | Nakano et al. | 439/268 |
| 6,824,411 | B2 | * | 11/2004 | Ohshima | 439/266 |
| 6,899,558 | B2 | * | 5/2005 | Okamoto | 439/331 |
| 2001/0002345 | A1 | * | 5/2001 | Ohshima | 439/266 |
| 2002/0177344 | A1 | * | 11/2002 | Nakano et al. | 439/266 |
| 2003/0008544 | A1 | * | 1/2003 | Nakano | 439/331 |
| 2003/0032320 | A1 | * | 2/2003 | Abe et al. | 439/268 |

FOREIGN PATENT DOCUMENTS

| JP | 6-92447 | 4/1994 |
| JP | 6-47881 | 6/1994 |
| JP | 7-201428 | 8/1995 |
| JP | 8-233899 | 9/1996 |
| JP | 8-334546 | 12/1996 |
| JP | 9-51029 | 2/1997 |
| JP | 9-113580 | 5/1997 |
| JP | 10-160797 | 6/1998 |
| JP | 2904782 | 3/1999 |
| JP | 11-333775 | 12/1999 |
| JP | 3059946 | 4/2000 |
| JP | 2001-242218 | 9/2001 |
| JP | 2002-71750 | 3/2002 |

* cited by examiner

Primary Examiner—Ross Gushi
(74) Attorney, Agent, or Firm—Finnegan, Henderson, Farabow, Garrett & Dunner, LLP

(57) ABSTRACT

A guide member is supported to be movable relative to an accommodation portion of a contact-moving member An engagement pin is engaged with a post portion so that the maximum displacement of the guide member is limited within the maximum displacement of a semiconductor element. The inner circumference of the accommodation portion of the contact-moving member is brought into contact with the outer circumference of the guide member so that the maximum displacement A of the contact-moving member is limited. Thus, a gap CL (=A−B) is defined between the inner circumference of the contact-moving member and an end surface of the guide member opposed thereto.

9 Claims, 9 Drawing Sheets

SEMICONDUCTOR DEVICE SOCKET

This application claims priority from Japanese Patent Application No. 2003-423833 filed Dec. 19, 2003, which is incorporated hereinto by reference.

BACKGROUND OF THE INVENTION

1. Field of the Invention

The present invention relates to a semiconductor device socket used for testing a semiconductor device.

2. Description of the Related Art

Semiconductor devices are subjected to various tests prior to being mounted to electronic equipment or others so that latent defects thereof are found and removed. The tests are carried out in a non-destructive manner by the application of voltage stress, the operation and storage under a high temperature condition in correspondence to the thermal/mechanical environmental tests.

The semiconductor device socket used for such tests is generally called as an IC socket which, as shown in Japanese Patent No. 3059946 and also in FIG. 7, is mounted onto a printed circuit board 2 having an input/output section for supplying a predetermined test voltage to the semiconductor device to be tested and transmitting abnormal signals representing the short-circuit or others from the semiconductor device as an object being tested.

The semiconductor device socket fixed on the printed circuit board 2, includes a socket body 4 having an accommodation portion 4a for accommodating a contact-moving member 8 described later to be movable relative to a pair of movable contact portions of a contact terminal 16ai (i=1 to n, n is a positive integer), a guide member 10 having an accommodation portion 10a, in which is mounted a semiconductor device such as a semiconductor element 6 of a BGA (ball grid array) type (see FIG. 8A), for guiding the semiconductor element 6 to the accommodation portion 10a and positioning the semiconductor element 6 relative to the contact terminal 16ai, a contact-moving member 8 disposed in the socket body 4 to be reciprocatable in a predetermined direction, for moving one movable contact portion 16M of the contact terminal 16ai close to or apart from the other movable contact portion 16F described later, and a cover member 12 for transmitting an applied operating force to the contact-moving member 8 as a driving force via a drive mechanism (not shown) of the contact-moving member 8.

At a predetermined position on the printed circuit board 2, there are a group of electrodes electrically connected to the input/output section via conductor layers. As shown in FIG. 7, proximal end terminals 16B of the plurality of contact terminals 16ai provided in the socket body 4 disposed on the printed circuit board 2 are connected to the group of electrodes.

The socket body 4 has the accommodation portion 4a, from which are projected outward the movable contact portions 16M and 16F of the plurality of contact terminals 16ai.

The respective contact terminal 16ai includes a proximal terminal 16B provided in the socket body 4 in correspondence to each of electrodes 6a of the semiconductor element 6 to mounted, and the pair of movable contact portions 16F and 16M coupled to the terminal 16B and selectively nipping the respective electrode 6a of the semiconductor element 6 to have the electric connection thereto. As shown in FIGS. 8A and 8C, in accordance with the movement of the contact-moving member 8, the pair of movable contact portions 16F and 16M are close to each other to nip the respective electrode 6a of the semiconductor element 6 or away from each other to release an electrode 6a from the nip.

The contact-moving member 8 fixing the guide member 10 to the upper portion thereof while inhibiting the relative movement of a bottom of the guide member 10 is disposed in the accommodation portion 4a of the socket body 4 to be movable in the moving direction of the movable contact portions 16M and 16F of the respective contact terminal 16ai.

The contact-moving member 8 has openings in the interior thereof, through each of which project outward the movable contact portions 16M and 16F of the respective contact terminal 16ai. The respective openings in the same row are separated from those in the adjacent different rows by partitioning walls (not shown).

In the contact-moving member 8, between the adjacent openings in the same row from which the movable contact portions 16M and 16F of the respective contact terminal 16ai are projected, there is a movable contact presser portion 8P formed to separate the movable contact portion 16M and the movable contact portion 16F. Further, there is a biasing member not shown between one end of the contact-moving member 8 and the inner circumference of the accommodation portion 4a of the socket body 4, for biasing the contact-moving member 8 to an initial position shown in FIGS. 7 and 8C. At the initial position, one of end surfaces of the contact-moving member 8 is brought into close contact with the inner circumference of the accommodation portion 4a of the socket body 4 without any gap.

Further, the contact-moving member 8 is coupled to a drive mechanism comprised of a lever and a pin as shown in Japanese Patent No. 3059946. One end of the lever of the drive mechanism touches to an end portion of the cover member 12.

Thereby, when the contact-moving member 8 is made to move against a biasing force of biasing means in the direction shown by an arrow M in FIG. 8A as the cover member 12 descends in the direction shown by an arrow D in FIG. 8A, the movable contact presser portion 8P moves to separate the movable contact portion 16M of the respective contact terminal 16ai from the movable contact portion 16F. On the other hand, in accordance with the upward movement of the cover member 12 as shown in FIG. 8B, the contact-moving member 8 moves in the direction opposite to that indicated by an arrow M in FIG. 8A by the biasing force of the biasing means and the recovery force of the movable contact portion 16M.

As shown in FIG. 7, the guide member 10 has, in a central portion thereof, the accommodation portion 10a for detachably mounting the semiconductor element 6 therein. The inner circumference of the accommodation portion 10a is formed of a flat surface opposed to the respective end surfaces of the semiconductor element 6 of a square shape, an inclined surface coupling the flat surface to an upper end surface, and a bottom surface intersecting the flat surface. A dimension of the inner circumference of the accommodation portion 10a is larger than the outer dimension of the semiconductor element 6 to be mounted therein with a predetermined tolerance. That is, as shown in FIGS. 8A and 8C, when the contact-moving member 8 maximally moves, a value of a gap C between the respective end surface of the semiconductor element 6 and the flat surface of the guide member 10 is determined to be smaller than the difference (A−B) between the maximum displacement amount A of the movable contact presser portion 8P from the position shown in FIG. 7 to the position shown in FIG. 8A (the displacement amount of the contact-moving member 8) and the maximum displacement amount B of the respective electrode 6a of the semiconductor element 6 following the former (the displacement amount of the semiconductor element 6); i.e., C<A−B. In this regard, the maximum displacement amount B is smaller than the maximum displacement amount A.

The cover member 12 is provided with an opening 12a in the interior thereof to encircle the guide member 10. The cover member 12 is supported by the socket body 4 to be movable upward and downward relative to the socket body 4.

According to such a structure, when the semiconductor element 6 held by a hand of a conveyor robot not shown is mounted to the accommodation portion 10a of the guide member 10 through the opening 12a, the cover member 12 is initially made to descend to the lowermost position shown in FIG. 8A by a presser portion of the conveyor robot and simultaneously therewith, the semiconductor element 6 is lowered. Thereby, as shown in FIG. 8A, the contact-moving member 8 is displaced against the biasing force of the biasing means.

Then, as shown in FIG. 9A in an enlarged manner, in a state that the movable contact presser portion 8P is displaced to move the movable contact portion 16M of the respective contact terminal 16ai away from the movable contact portion 16F and held there, the semiconductor element 6 is placed in the accommodation portion 10a of the guide member 10, whereby the electrode 6a of the semiconductor element 6 is positioned between the movable contact portions 16M and 16F of the respective contact terminal 16ai.

When the cover member 12 rises as shown in FIG. 8B in a state that the respective electrode 6a of the semiconductor element 6is positioned between the movable contact portions 16M and 16F of the contact terminal 16ai, the contact-moving member 8 is displaced to the initial position by the biasing force of the biasing means and the recovery force of the movable contact portion 16M, and the movable contact presser portion 8P is away from the movable contact portion 16M to be brought into contact with the movable contact portion 16F.

Accordingly, as shown in FIGS. 8B and 9B, the electrode 6a of the semiconductor element 6 is nipped by the movable contact portions 16M and 16F of the contact terminal 16ai, and thus the electrode 6a of the semiconductor element 6 is electrically connected to the contact terminal 16ai.

In such a semiconductor device socket, as shown in FIG. 8B, when the cover member 12 rises and the contact-moving member 8 is displaced to the initial position by the biasing force of the biasing means and the recovery force of the movable contact portion 16M, there is a case in that the end surface of the semiconductor element 6 may interfere with the flat surface of the accommodation portion 10a in the guide member 10. That is, as stated above, since the value of gap C is determined to be smaller than the difference (A−B) between the maximum displacement amount A of the movable contact presser portion 8P from the position shown in FIG. 7 to the position shown in FIG. 8A (the displacement amount of the contact-moving member 8) and the maximum displacement amount B of each electrode 6a of the semiconductor element following thereto (the displacement amount of the semiconductor element 6), the interference amount D (=A−B−C) does not become nearly equal to zero, and, in addition, there may be a case wherein the difference between the maximum displacement amounts A and B becomes large in accordance with sizes of the respective electrode 6a of the semiconductor element 6 to be a positive value exceeding zero. This is also caused by a fact that there is a limitation in increase of the value of gap C in view of the requirement for the positioning accuracy.

Also, as shown in FIG. 8C, when the semiconductor element 6 interfering with the flat surface of the accommodation portion 10a is further pressed by the displacement of the guide member 10, there is a risk of a so-called one-side contact wherein the electrode 6a of the semiconductor element 6 is away from the movable contact portion 16M as shown enlargedly in FIG. 8D.

In such a case, the value of gap C between the respective end surface of the semiconductor element 6 and the flat surface of the guide member 10 may be properly determined when the contact-moving member 8 maximally moves. Alternatively, after the contact-moving member 8 returns to the original position, the value of gap C between the respective end surface and the flat surface of the guide member 10 may be properly determined. In the latter case, a center of the guide member 10 may deviate from a center of a group of contact terminals 16ai, whereby a center of the electrode 6a of the semiconductor element 6 is not located between the movable contact portions 16M and 16F and accordingly, it is difficult to mount the semiconductor element 6.

Accordingly, as disclosed in Japanese Patent No. 2904782, a structure is proposed for limiting the amount of the displacement of the guide member to the contact-moving member within a predetermined range by supporting the guide member on the contact-moving member to be movable relative to the latter.

SUMMARY OF THE INVENTION

A device capable of moving the guide member relative to the contact-moving member within a predetermined range as disclosed in Japanese Patent No. 2904782 is effective for facilitating the recovery displacement of the movable contact portion 16M of the respective contact terminal 16ai.

However, there is a case in that the interference of the end surface of the semiconductor element 6 with the flat surface of the accommodation portion 10a of the guide member 10 described above is not assuredly avoidable solely by the structure wherein the guiding member is movable relative to the contact-moving member within a predetermined range.

An object of the present invention is to solve the above-mentioned problems by providing a semiconductor device socket used for testing a semiconductor device, capable of assuredly avoiding the interference of the end surface of the mounted semiconductor element with the inner circumference defining the accommodation portion of the guide member.

To achieve the above object, the inventive semiconductor device socket comprises a socket body for supporting a proximal end of a contact terminal having a pair of movable contacts selectively brought into contact with a terminal of a semiconductor device and electrically connected thereto, a movable contact-moving member disposed in the socket body to be movable thereto and having a pressing for moving the pair of movable contacts close to and away from the terminal of the semiconductor device, a guide member disposed an accommodation portion of the movable contact-moving member, for guiding the semiconductor device to locate the terminal of the semiconductor device to the pair of movable contacts so that a predetermined gap is defined between an end surface of the semiconductor device and the guide member, and a displacement restricting section for limiting the maximum displacement of the guide member, wherein the predetermined gap is determined in accordance with the difference between the maximum displacement of the movable contact-moving member and the maximum displacement of the semiconductor device and the displacement restricting section limits the maximum displacement of the guide member within the maximum displacement of the semiconductor device.

As apparent from the above description, according to the inventive semiconductor device socket, the predetermined gap is determined in accordance with the difference between the maximum displacement of the guide member and the maximum displacement of the semiconductor device. Since the displacement restricting section limits the maximum displacement of the guide member within the maximum displacement of the semiconductor device, the difference between the maximum displacement of the guide member and the maximum displacement of the semiconductor device is constant, whereby the interference of the end surface of the mounted semiconductor device with the inner circumference of the accommodation portion is assuredly avoidable.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 2:
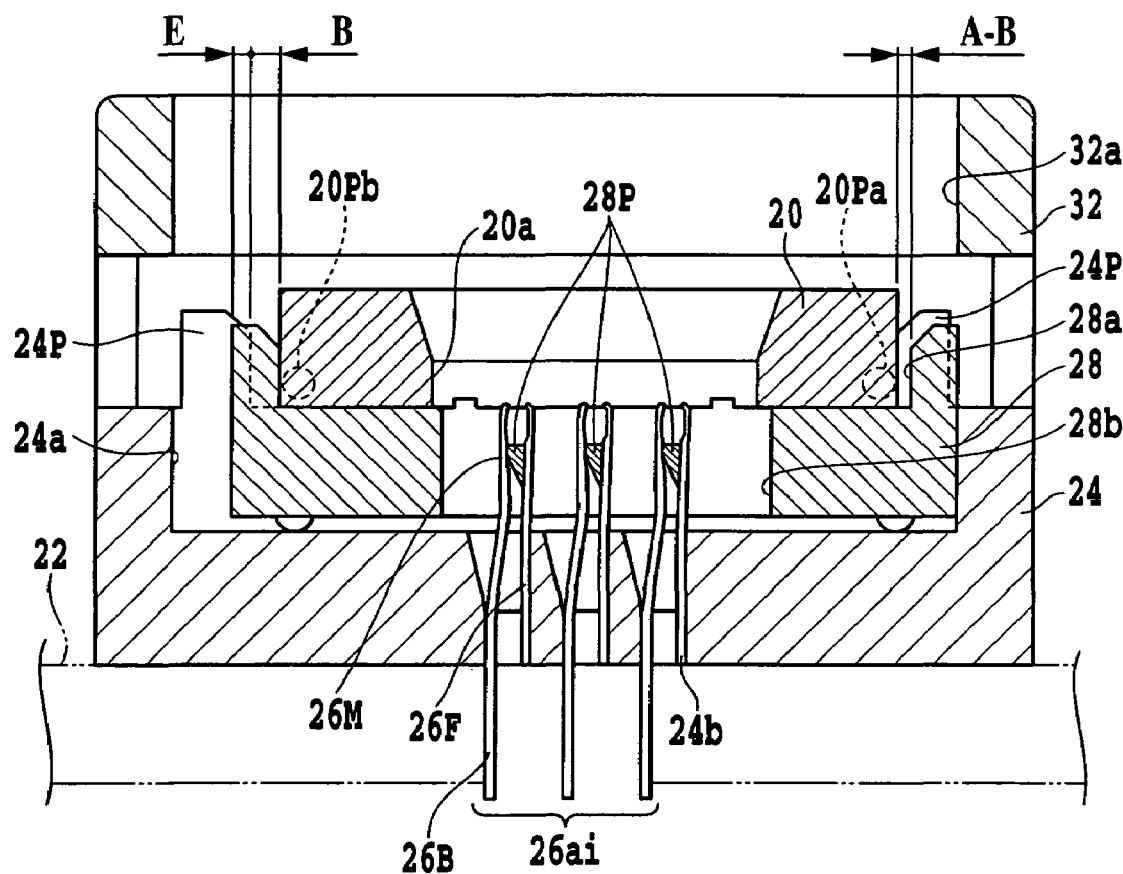
FIG. 2 is a sectional view schematically illustrating a total structure of the inventive semiconductor device socket according to the first embodiment.

FIG. 2 schematically illustrates a total structure of the inventive semiconductor device socket according to a first embodiment.

In FIG. 2, a semiconductor element described later is not yet mounted.

In FIG. 2, the semiconductor device socket includes a socket body 24 fixed to a printed circuit board 22 for accommodating a contact-moving member 28 described later to be movable relative to a pair of movable contact portions of a contact terminal 26$ai$ (i= 1 to n, n is a positive integer), a guide member 20 having an accommodation portion 20$a$ for mounting a semiconductor element 36, for example, of a BGA (ball grid array) type as a semiconductor device (see FIG. 3) therein and guiding the semiconductor element 36 to the accommodation portion 20$a$ as well as locating the semiconductor element 36 relative to contact terminals 26$ai$, a contact-moving member 28 disposed in the socket body 24 to be reciprocatable in the predetermined direction, for moving one movable contact portion 26M of the contact terminal 26$ai$ close to or away from the other movable contact portion 26F, and a cover member 32 for transmitting the operating force to the contact-moving member 28 as a driving force via a drive mechanism of the contact-moving member 28.

A group of electrodes to be electrically connected to an input/output section of the printed circuit board 22 via a conductive layer are provided at a predetermined position in the printed circuit board 22. As shown in FIG. 2, proximal terminals 26B of a plurality of contact terminals 26$ai$ provided in the socket body 24 disposed on the printed circuit board 22 are connected to the group of the electrodes.

The socket body 24 has an accommodation portion 24$a$ in the interior thereof, into which project the movable contact portions 26M and 26F of the plurality of contact terminals 26$ai$. Also, the socket body 24 has supporting holes 24$b$ into which are press-fit the proximal ends of the respective contact terminals. One end of the supporting hole 24$b$ opens to the interior of the accommodation portion 24$a$.

Post portions 24P are provided as a displacement restricting section at four positions on the peripheral edge of the accommodation portion 24$a$ in the socket body 24 integral therewith.

Figure 1:
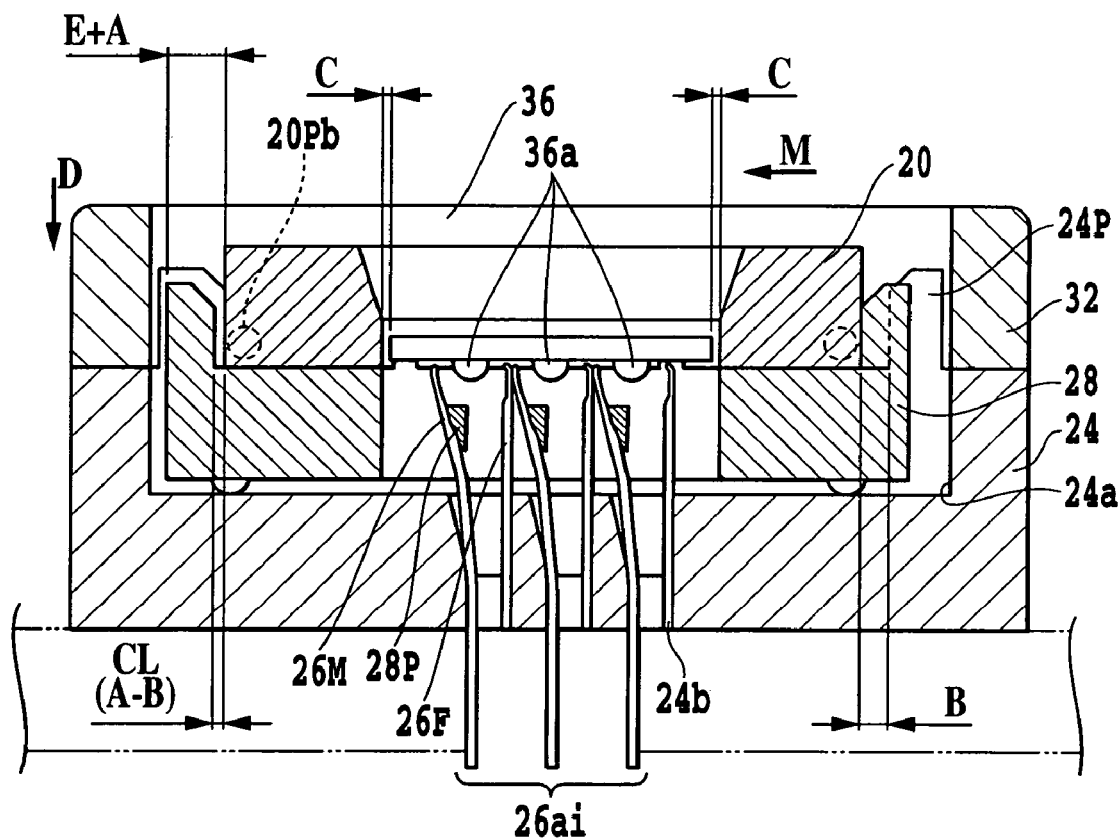
FIG. 1 is a sectional view illustrating the operation of the inventive semiconductor device socket according to a first embodiment.
Figure 3:
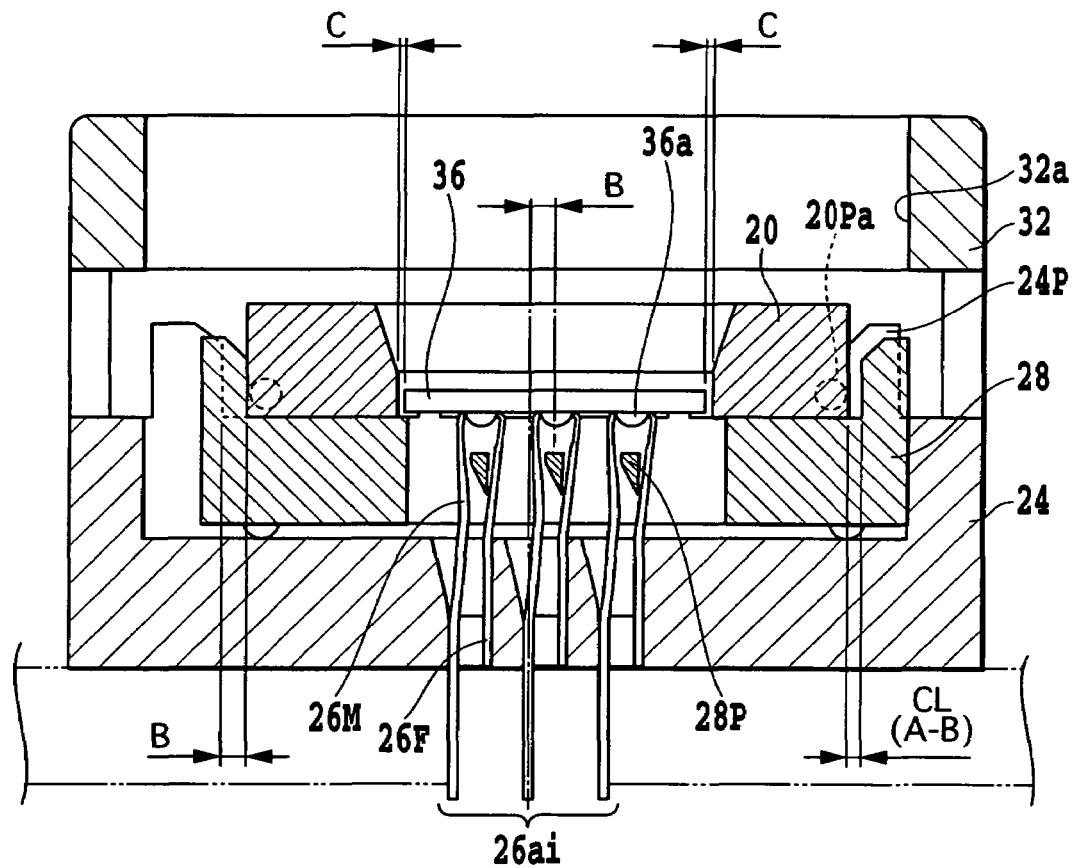
FIG. 3 is a sectional view illustrating the operation of the inventive semiconductor device socket according to a second embodiment.

The respective contact terminal 26$ai$ consists of the proximal terminal 26B provided in the socket body in correspondence to the respective electrode 36$a$ of the semiconductor element 36 to be mounted and a pair of movable contact portions 26F and 26M coupled to the terminal 26B for selectively nipping the electrode 36$a$ of the semiconductor element 36 to make the electrical connection therewith. As shown in FIGS. 1 and 3, the pair of movable contact portions 26F and 26M move in accordance with the movement of the contact-moving member 28 close to each other to nip the electrode 36$a$ of the semiconductor element 36 or away from each other to release the electrode 36$a$ of the semiconductor element 36.

The contact-moving member 28 supporting the bottom of the guide member 20 while allowing the relative movement is disposed in the accommodation portion 24$a$ of the socket body 24 to be movable in the moving direction of the movable contact portions 26M and 26F.

The contact-moving member 28 as a movable contact-moving member has an opening 28$b$ in the interior thereof, through which project the movable contact portions 26M and 26F of the contact terminal 26$ai$. The opening 28$b$ in the same row is separated from that in the adjacent different row by a partition wall not shown. The partition wall is formed at a predetermined pitch in correspondence to the respective contact terminals 26$ai$ generally in the vertical direction to a paper surface.

A plurality of movable contact presser portions 28P are provided in the opening 28$b$ of the same row in the contact-moving member 28 so that the opening 28$b$ is divided into a plurality areas and the movable contact portion 26M is separated from the movable contact portion 26F. Further, there is a biasing member not shown between one end of the contact-moving member 28 and the inner circumference of the accommodation portion 24$a$ of the socket body 24, for returning the contact-moving member 28 from a position shown in FIG. 1 to a position shown in FIG. 3.

At an initial position, as shown in FIG. 2, one end surface of the contact-moving member 28 generally vertical to the moving direction is in close contact with the inner surface of the accommodation portion 24a of the socket body 24.

The contact-moving member 28 is coupled to a driving mechanism formed of a lever and a pin as shown in Japanese Patent No. 3059946. One end of the driving mechanism abuts to an end portion of the cover member 32.

Thereby, when the contact-moving member 28 moves against a biasing force of the biasing means in the direction shown by an arrow M in FIG. 1 as the cover member 32 descends in the direction shown by an arrow D in FIG. 1, the movable contact presser portion 28P moves to separate the movable contact portion 26M of the respective contact terminal 26ai away from the movable contact portion 26F. On the other hand, as shown in FIG. 3, as the cover member 32 rises, the contact-moving member 28 is made to move in the direction opposite to that indicated by an arrow M in FIG. 1 by the biasing force of the biasing means and the recovery force of the movable contact portion 26M.

The guide member 20 has the accommodation portion 20a at a center thereof for mounting therein the semiconductor element 36 in a detachable manner. For example, the semiconductor element 36, for example, held by and released from a handler of a conveyor robot is automatically guided and positioned to the interior of the accommodation portion 20a by the free fall from a predetermined height.

The inner circumference of the accommodation portion 20a is formed of a flat surface opposed to the respective four end surfaces of the semiconductor element 36 of a generally square shape, an inclined surface coupling an upper end surface to the flat surface and a bottom surface intersecting the flat surface. A dimension of the inner surface of the accommodation portion 20a is larger than an outer dimension of the semiconductor element 36 to be mounted thereto at a predetermined tolerance. That is, as shown in FIG. 1, when the contact-moving member 28 is maximally displaced, a value of gap C between the respective end surface of the semiconductor element 36 and the flat surface of the guide member 20 is determined to be smaller than the difference (A−B) between the maximum displacement A of the contact-moving member 28 (the movable contact pressing portion 28P) from a position shown in FIG. 2 to a position shown in FIG. 1 and the maximum displacement B of the semiconductor element 36 (the respective electrode 36a of the semiconductor element 36); i.e., C<A−B. In this regard, the maximum displacement B is smaller than the maximum displacement A.

In the vicinity of the opposite end surfaces of the guide member 20 generally vertical to the moving direction, engagement pins 20Pa and 30Pb are provided for selectively engaging with the above-mentioned post portions 24P. In a state shown in FIG. 2 wherein the engagement pin 20P on one end surface side of the guide member 20 generally vertical to the moving direction is in contact with the post portion 24P, it is determined that a gap between the other end surface of the guide member 20 and an end surface of the post portion 24P is equal to the above-mentioned maximum displacement B. Since the other end surface of the guide member 20 is in contact with the inner circumference of the accommodation portion 28a in the contact-moving member 28 at that time, the contact-moving member 28 is located at a predetermined position. On the other hand, a gap CL (=A−B) is formed between the one end surface of the guide member 20 and the inner circumference of the accommodation portion 28a of the contact-moving member 28 in accordance with the difference between the maximum displacement A of the contact-moving member 28 (the movable contact pressing portion 28P) and the maximum displacement B of the semiconductor element 36 (the respective electrode 36a of the semiconductor element 36) following to the former.

Also, in a state shown in FIG. 1 wherein the engagement pin 20Pb on one end surface of the guide member 20 generally vertical to the moving direction is in contact with the post portion 24P, it is determined that a gap between the other end surface of the guide member 20 and an end surface of the post portion 24P is equal to the above-mentioned maximum displacement B. Since the other end surface of the guide member 20 is in contact with the inner circumference of the accommodation portion 28a in the contact-moving member 28 at that time in a similar manner as described above, the contact-moving member 28 is located at a predetermined position. On the other hand, a gap CL (=A−B) is formed between the one end surface of the guide member 20 and the inner circumference of the-accommodation portion 28a of the contact-moving member 28 in accordance with the difference between the maximum displacement A of the contact-moving member 28 (the movable contact pressing portion 28P) and the maximum displacement B of the semiconductor element 36 (the respective electrode 36a of the semiconductor element 36) following to the former.

The cover member 32 has an opening 32a inside thereof, to encircle the outer circumference of the guide member 20. The cover member 32 is supported by the socket body 24 to be movable upward and downward.

In such a structure, when the semiconductor element 36 held by a hand of the conveyor robot not shown is mounted into the accommodation portion 28a of the guide member 28 through the opening 32a, the cover member 32 first descends to the lowermost position shown in FIG. 1 in the direction indicated by an arrow D from a state shown in FIG. 2, whereby the semiconductor element 36 also descends. Thereby, as shown in FIG. 1, the contact-moving member 28 is made to move in the direction indicated by an arrow M against the biasing force of the biasing means. At that time, the movable contact portion 26M of the respective contact terminal 26ai is away from the movable contact portion 26F. Also, by the abutment of the engagement pin 20Pb of the guide member 20 to the post portion 24P, the guide member 20 is located to a predetermined position, whereby the gap CL is defined between the end surface of the guide member 20 on the engagement pin 20Pb side and the inner circumference of the accommodation portion 28a. The gap CL is a value corresponding to the difference between the maximum displacement A of the contact-moving member 28 (the movable contact pressing portion 28P) and the maximum displacement B of the semiconductor 36 (the respective electrode 36a of the semiconductor element 36). That is, as shown in FIG. 2, in the state wherein the end surface of the guide member 20 on the engagement pin 20Pb side abuts to the inner circumference of the accommodation portion 28a of the contact-moving member 28, it is assumed that a distance between the end surface of the post portion 23P and the outer circumferential end surface of the contact-moving member 28 is a predetermined value E. When the contact-moving member 28 moves in the direction indicated by an arrow M in the FIG. 1 by the maximum displacement A, a distance between the end surface of the post portion 24P and the outer circumferential end surface of the contact-moving member 28 becomes the value E plus the maximum displacement A. Accordingly, the gap CL (=E+A−E− B) is formed between the inner circumference of the guide member 20 on the on the engagement pin 20Pb side and the end surface of the guide member 20 on the engagement pin 20Pb side.

Then, in a state wherein the movable contact pressing portion 28P moves to separate the movable contact portion 26M of the contact terminal 26ai away from the movable contact portion 26F and is held there, the semiconductor element 36 is placed in the accommodation portion 20a of the guide member 20, whereby each of the electrodes 36a of the semiconductor element 36 is located between the movable contact portions 26M and 26F of the respective contact terminal 26ai. As a result, since the maximum displacement B is limited by the abutment of the engagement pin 20Pb of the guide member 20 to the post portion 24P, while the maximum displacement A is limited by the abutment of the end surface of the guide member 20 on the engagement pin 20Pa side to the inner circumference of the accommodation portion 28a of the contact-moving member 28, the difference (A–B) between the maximum displacement A and the maximum displacement B does not increase but is always maintained at a constant value. Accordingly, the gap C is assuredly secured and the interference of the end surface of the semiconductor element 36 with the inner circumferential surface 20a of the guide member 20 is completely avoidable.

In a state wherein the electrode 36a of the semiconductor element 36 is disposed between the movable contact portions 26M and 26F, the cover member 32 rises as shown in FIG. 3 whereby the contact-moving member 28 is made to move to the initial position due to the biasing force of the biasing means and the recovery force of the movable contact portion 26M. Thus, the movable contact pressing portion 28P is away from the movable contact portion 26M and in contact with the movable contact portion 26F.

Accordingly, as shown in FIG. 3, the electrode 36a of the semiconductor element 36 is nipped by the movable contact portions 26M and 26F of the contact terminal 26ai and electrically connected to the contact terminal 26ai.

At that time, the engagement pin 20Pb of the guide member 20 abuts to the post portion 24P to restrict the guide member 20 at a predetermined position. Accordingly, the gap CL is formed between the end surface of the guide member 20 on the engagement pin 20Pa side and the inner circumference of the accommodation portion 28a of the guide member 28. As a result, the maximum displacement B is limited by the abutment of the engagement pin 20Pb of the guide member 20 to the post portion 24P, and the maximum displacement A is limited by the abutment of the end surface of the guide member 20 on the engagement pin 20Pa side to the inner circumference of the accommodation portion 28a of the contact-moving member 28, whereby the difference (A–B) between the maximum displacement A and the maximum displacement B does not increase but is always maintained at a constant value. Accordingly, the gap C is assuredly secured and the interference of the end surface of the semiconductor element 36 with the inner circumferential surface 20a of the guide member 20 is completely avoidable.

Figure 4:
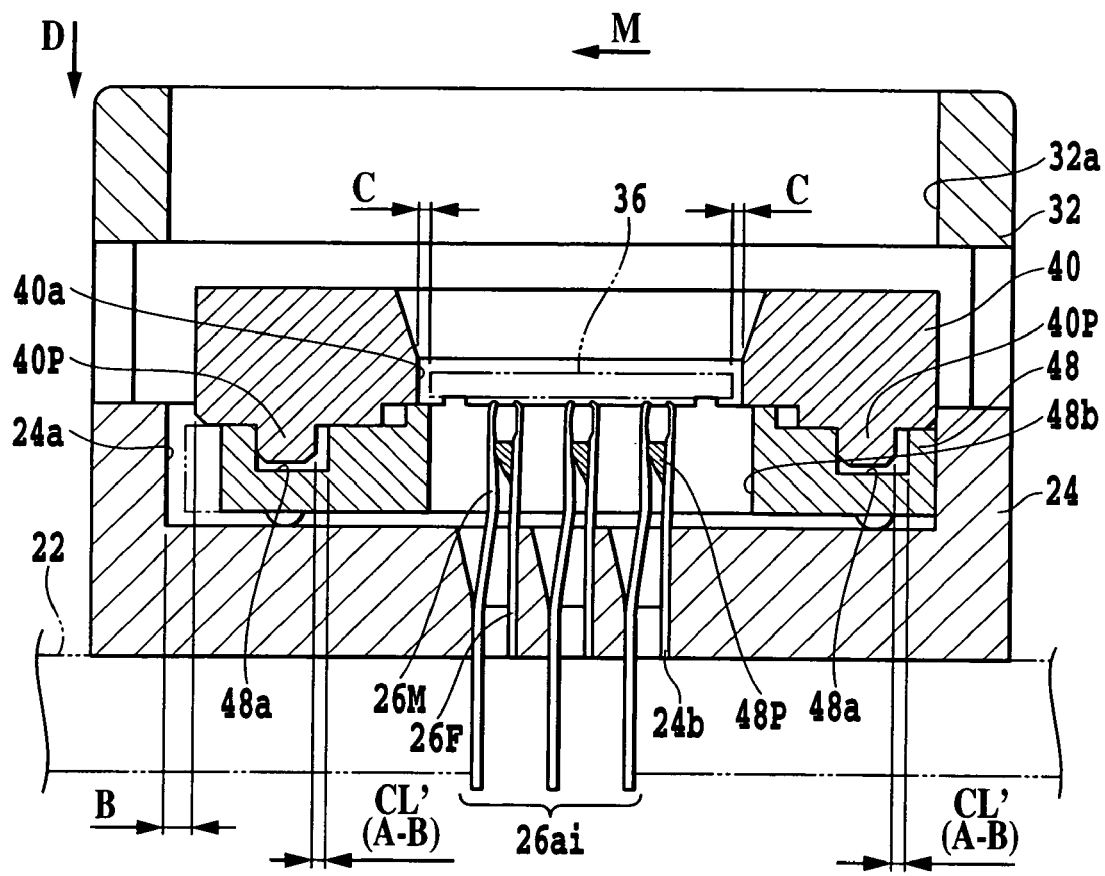
FIG. 4 is a sectional view schematically illustrating a total structure of the inventive semiconductor device socket according to the second embodiment.

FIG. 4 schematically illustrates a total structure of the inventive semiconductor device socket according to a second embodiment. In FIG. 4, a semiconductor element described later is not yet mounted to the socket.

In this regard, in the embodiment shown in FIG. 4 and other embodiments described later, the same constituent elements as those in FIG. 2 are denoted by the same reference numerals and the explanation thereof will be eliminated.

In the embodiment shown in FIG. 2, the abutment of the engagement pin 20Pa or 20Pb to the post portion 24P limits the maximum displacement of the guide member 20. In the embodiment shown in FIG. 4, the maximum displacement of a guide member 40 is limited by the abutment of the end surface of the outer circumference of the guide member 40 generally vertical to the moving direction and the inner circumference of the accommodation portion 24a of the socket body 24, whereby a predetermined gap CL' (=A–B) is formed in a joint between a contact-moving member 48 and the guide member 40.

The contact-moving member 48 for supporting the bottom of the guiding member 40 to be relatively movable is provided in the accommodation portion 24a of the socket body 24 to be movable in the moving direction of the movable contact portions 26M and 26F of the respective contact terminal 26a.

The contact-moving member 48 has an opening 48b in the interior thereof, into which project the movable contact portions 26M and 26F of the respective contact terminal 26ai. The respective openings 48b in the same row are separated from openings in the adjacent rows by partition walls not shown. The partition walls are formed at a predetermined pitch generally D vertical to the paper surface in correspondence to the contact terminals 26ai.

In the contact-moving member 48, the respective opening 48b is provided with a plurality of movable contact pressing portions 48P for dividing the opening 48b into a plurality of sections and separating the movable contact portion 26M from the movable contact portion 26F.

On a surface of the contact-moving member 48 along which slides the bottom of the guiding member 40, recesses 48a respectively engaged with projections 40P of the guide member 40 in a movable manner described later. The respective recess 48a guides the projection 40P of the guide member 40 in the moving direction of the guide member 40. At that time, as shown in FIG. 4, in an initial state wherein the cover member 32 is at the uppermost position, the predetermined gap CL' (=A–B) is formed at right-hand of FIG. 4 between the outer circumference of the projection 40P in the guide member 40 and the inner circumference forming the recess 48a wherein A is the maximum displacement of the contact-moving member 48 (the movable contact pressing portion 48P), and B is the maximum displacement of the semiconductor element 36 (the respective electrode 36a of the semiconductor element 36). Also, as shown FIG. 4, one end surface of the contact-moving member 48 generally vertical to the moving direction is in close contact with the inner circumference of the accommodation portion 24a of the socket body 24.

A biasing member not shown is provided for biasing the contact-moving member 48 to return the same from a position indicated by a two-dot chain line to a position indicated by a solid line in FIG. 4 between one end of the contact-moving member 48 and the inner circumference of the accommodation portion 24a of the socket body 24.

The contact-moving member 48 is coupled to a drive mechanism consisting of a lever and a pin as shown in Japanese Patent No. 3059946. On end of the lever of the drive mechanism abuts to an end portion of the cover member 32.

Thereby, when the contact-moving member 48 moves by the biasing force of the biasing means in the direction indicated by an arrow M in FIG. 4 as the cover member 32 descends in the direction indicated by an arrow D in FIG. 4, the movable contact pressing portion 48P moves the movable contact portion 26M of the contact terminal 26ai away from the movable contact portion 26F. On the other hand, as the cover member 32 rises, the contact-moving member 48 is made to move by the biasing force of the biasing means and the recovery force of the movable contact portion 26M in the direction opposite to the arrow M in FIG. 4.

As shown in FIG. 4, the guide member 40 is provided at a center thereof with an accommodation portion 40a in which the semiconductor element 36 is mounted. The inner circumference of the accommodation portion 40a is formed of a flat surface opposed to four end surfaces of the semiconductor element 36 of a generally square shape, an inclined surface coupling an upper end surface with the flat surface. A dimension of the inner circumference of the accommodation portion 40a is larger than an outer dimension of the semiconductor element 36 mounted therein at a predetermined tolerance. That is, as indicated by a two-dot chain line in FIG. 4, when the contact-moving member 48 maximally moves, a value of a gap C between the respective end surface of the semiconductor element 36 and the flat surface of the guide surface is determined to be smaller than the difference (A−B) between the maximum displacement A of the contact-moving member 48 (the movable contact pressing portion 48P) from the position shown in FIG. 2 to the position shown in FIG. 1 and the maximum displacement B of the semiconductor element 36 (the electrode 36a of the semiconductor element 36) following thereto; i.e., C<A−B).

Also, at the lower end of the guide member 40, there are the projections 40P guided into the respective recesses 48a.

In a state shown in FIG. 4 wherein one end surface of the guide member 40 generally vertical to the moving direction of the contact-moving member 48 is in contact with the inner circumference of the accommodation portion 24a of the socket body 24, a gap between the other end surface of the guide member 40 and the inner circumference of the accommodation portion 24a becomes a value of the above-mentioned maximum displacement B. At that time, since the end surface of the contact-moving member 48 is brought into contact with the inner circumference of the accommodation portion 24a, the contact-moving member 48 is located at a predetermined position.

On the other hand, a gap CL'=(A−B) is formed between the projection 40P of the guide member 40 and the peripheral edge forming the recess 48a of the contact-moving member 48 in correspondence to the difference between the maximum displacement A of the contact-moving member 48 (the moving contact pressing 48P) and the maximum displacement B of the semiconductor element 36 (the electrode 36a of the semiconductor element 36) following to the former.

Even in a state indicated by a two-dot chain line in FIG. 4 wherein one end surface generally vertical to the moving direction of the guide member 40 is brought into contact with the inner circumference of the accommodation portion 24a, a gap between the other 20 end surface of the guide member 40 and the inner circumference of the accommodation portion 24a is determined to be equal to the above-mentioned maximum displacement B. At that time, since the projection 40P of the guide member 40 is brought into contact with the peripheral edge of the recess 48a of the contact-moving member 48 in the same manner as described above, the contact-moving member 48 is located at a predetermined position. At that time, a gap CL'=(A−B) is formed on the leftside of FIG. 4 between the projection 40P of the guide member 40 and the peripheral edge forming the recess 48a of the contact-moving member 48 in correspondence to the difference between the maximum displacement A of the contact-moving member 48 (the moving contact pressing 48P) and the maximum displacement B of the semiconductor element 36 (the electrode 36a of the semiconductor element 36) following to the former.

Accordingly, in this structure, the same effect as in the above-mentioned first embodiment is obtainable.

Figure 5:
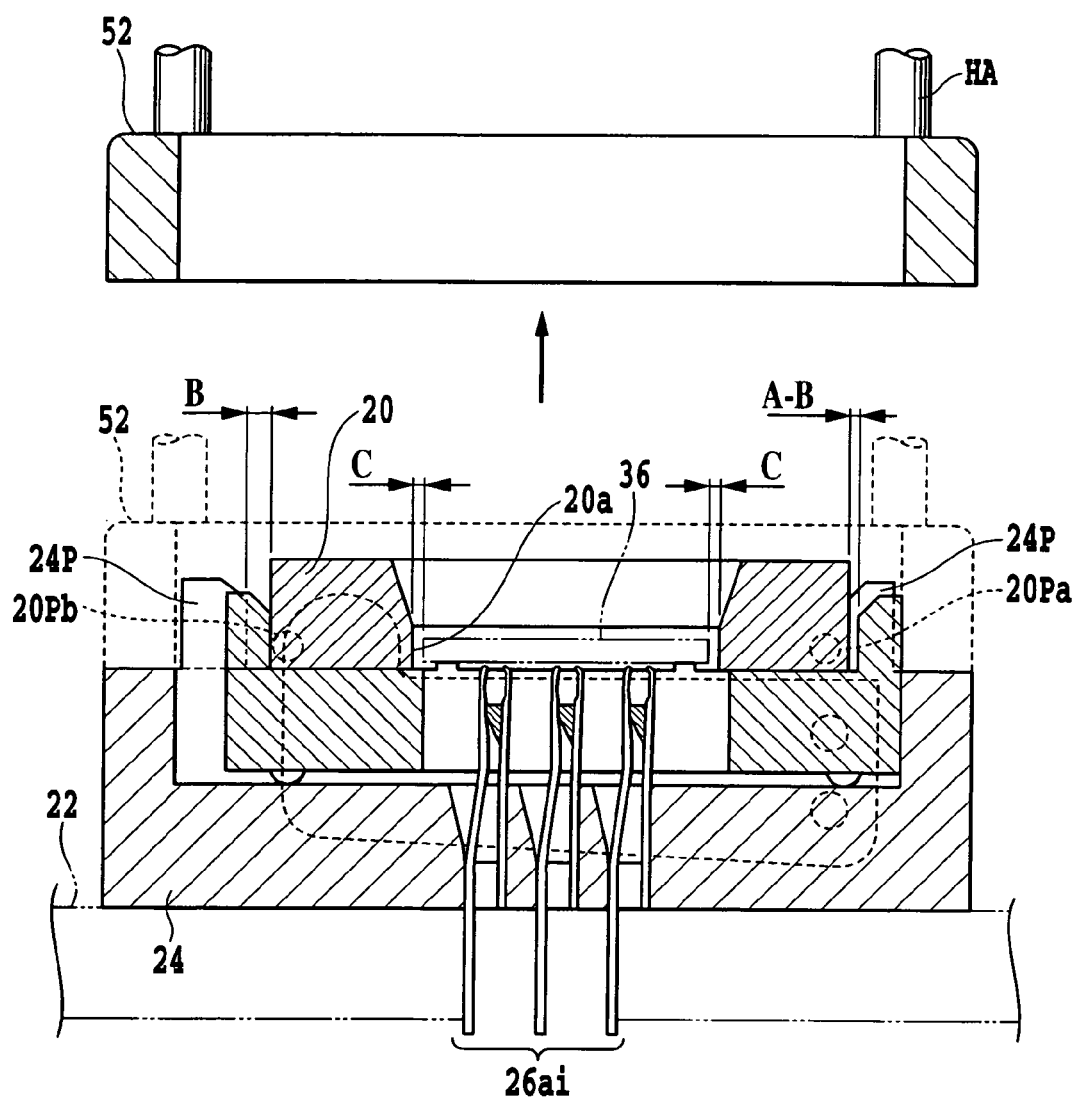
FIG. 5 is a sectional view schematically illustrating a total structure of the inventive semiconductor device socket according to a third embodiment.

FIG. 5 schematically illustrates a total structure of the inventive semiconductor device socket according to of a third embodiment wherein the semiconductor element 36 is not yet mounted thereto.

While the cover member 32 in the embodiment shown in FIG. 2 is supported by the socket body 24 to be movable upward and downward, in FIG. 5, a cover member 52 is provided separately from the socket body 24. That is, the cover member 52 is movable close to and away from the socket body 24 while being held by a handler HA of a robot not shown.

In such a structure, when the semiconductor element 36 is mounted to the socket body 24, a lower end of the cover member 52 held by the handler HA of the robot abuts to one end of a lever in a drive mechanism consisting of a lever and a pin as indicated by a broken line in FIG. 5. Thereby, the guide member 20 is made to move to be in the same state as shown in FIG. 1.

After the semiconductor element 36 has been mounted to the interior of the accommodation portion 20a of the guide member 20, the cover member 52 held by the handler HA of the robot is away from the socket body 24, whereby the semiconductor element 36 is held in the same state as shown in FIG. 3.

Accordingly, also in this embodiment, the same effect is obtainable as in the above-mentioned first embodiment.

Figure 6:
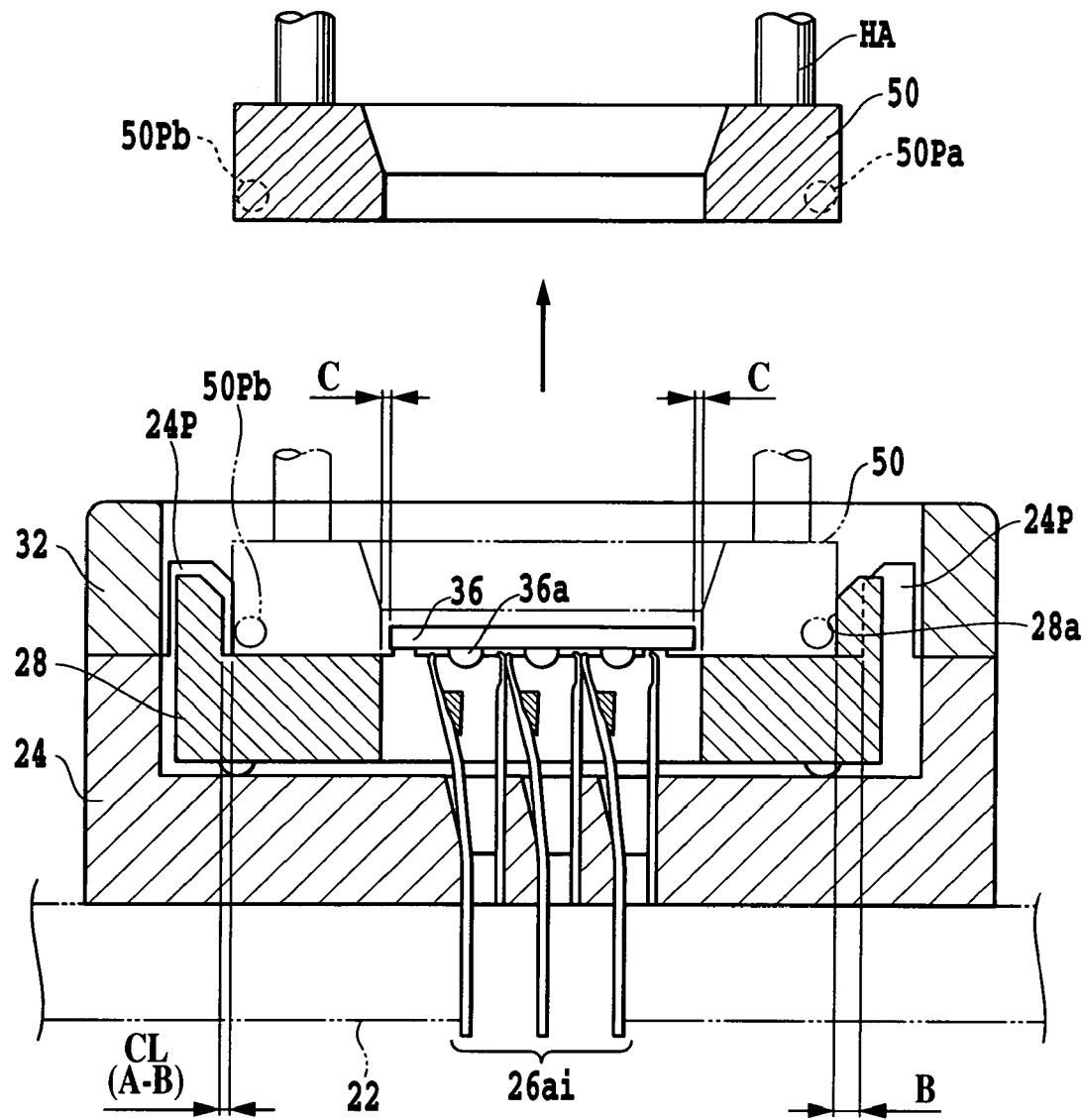
FIG. 6 is a sectional view schematically illustrating a total structure of the inventive semiconductor device socket according to a fourth embodiment.
Figure 7:
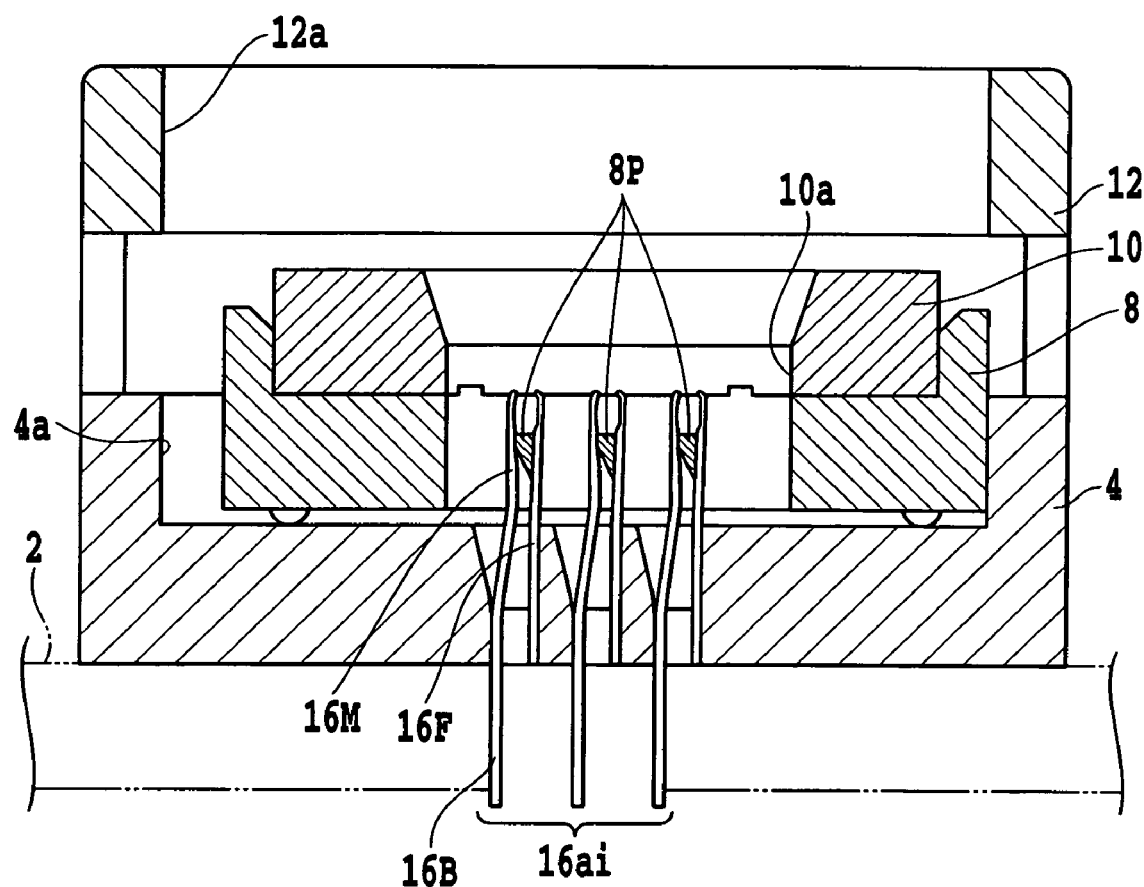
FIG. 7 is a sectional view schematically illustrating a total structure of the conventional device.
Figure 8A:
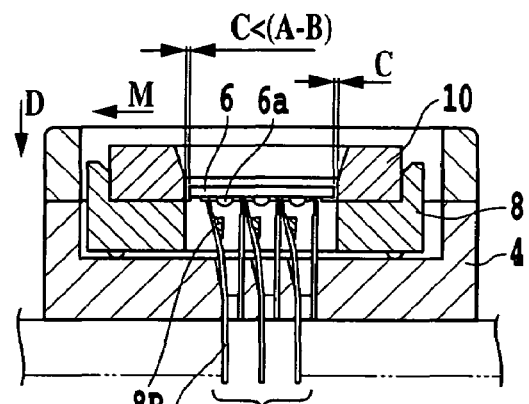
FIGS. 8A, 8B and 8C are sectional views for explaining the operation of the conventional device shown in FIG. 7.
Figure 8B:
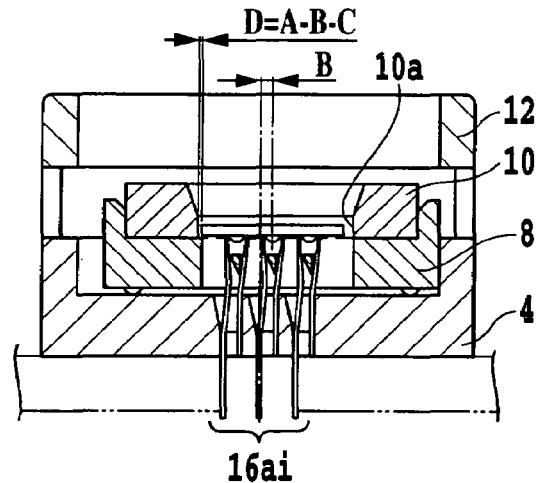
Figure 8C:
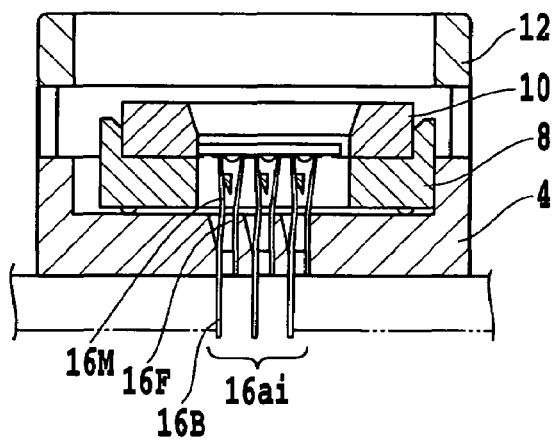
Figure 8D:
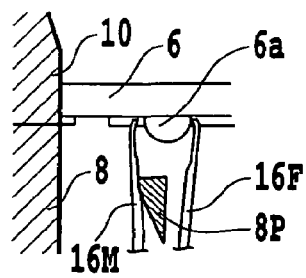
FIG. 8D is a partially enlarged view of FIG. 8C.
Figure 9C:
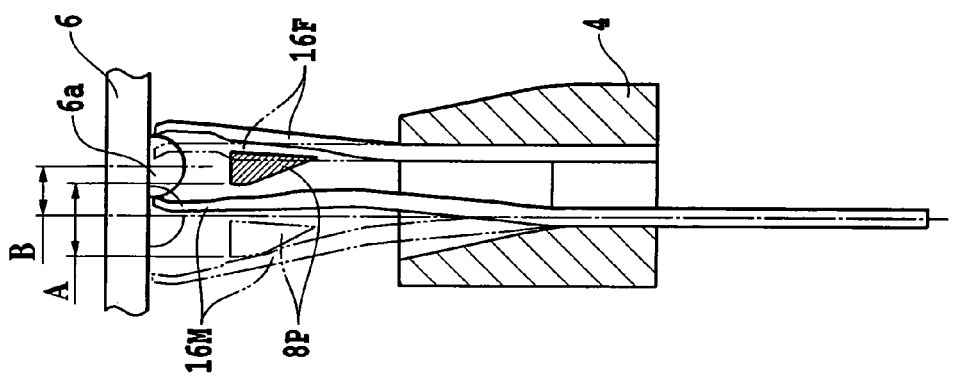
FIGS. 9A, 9B and 9C are partially enlarged views of FIGS. 8A, 8B and 8C, respectively.
Figure 9B:
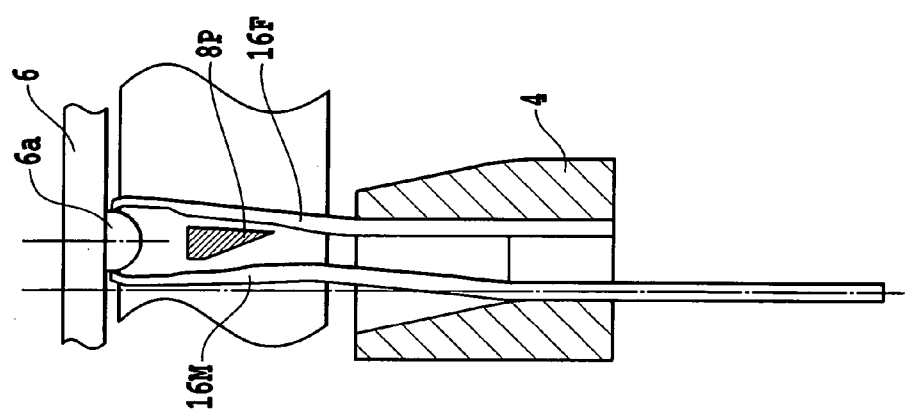
Figure 9A:
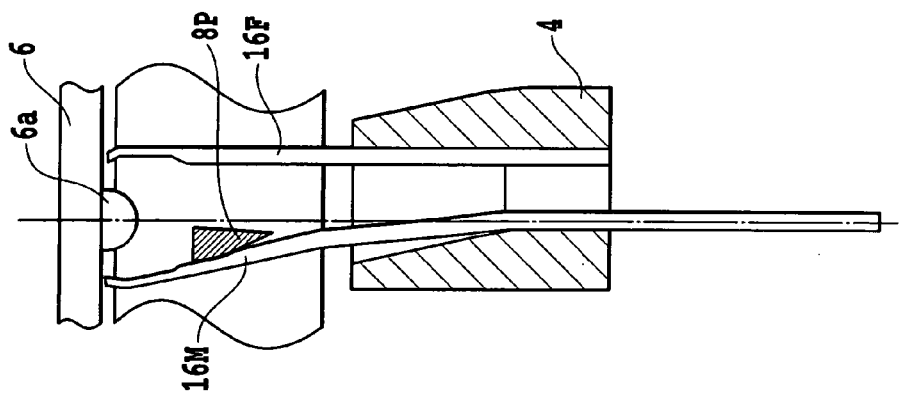

FIG. 6 schematically -illustrates a total structure of the inventive semiconductor device socket according to of a fourth embodiment wherein the cover member 32 descends to the lowermost position and the semiconductor element 36 is placed.

The guide member 20 is supported in the accommodation portion 28a of the contact-moving member 28 in a movable manner in the embodiment shown in FIG. 2. Alternatively, in FIG. 6, a guide member 50 is provided separately from the socket body 24. That is, the guide member 50 having engagement pins 50Pb and 50Pa is held by a handler HA of a robot not shown to be movable close to and away from the accommodation portion 28a. Such a structure is also disclosed in Japanese Patent Application Laid-open Nos. 6-92447(1994), 9-51029(1997), 8-334546(1996), 7-201428 (1995), 8-233899(1996), 11-333775(1999), 2002-71750, 9-113580(1997), 10-160797(1998), 2001-242218 and Japanese Utility Model Laid-open No. 6-47881(1994).

In this structure, when the semiconductor element 36 is mounted, as shown in FIG. 6, the cover member 32 descends to the lowermost position while a lower end of the guide member 50 held by a handler HA of a robot is brought into contact with the bottom of the accommodation portion 28a of the contact-moving member 28, and the engagement pin 50Pb thereof abuts to the post portion 24P as indicated by a broken line in FIG. 5. At that time, a value of a gap C between the respective end surface of the semiconductor element 36 and the flat surface of the guide member 50 is determined to be smaller than the difference between the maximum displacement A of the above-mentioned contact-moving member 28 (the movable contact pressing portion 28P) and the maximum displacement B of the semiconductor element 36 (the electrode 36a of the semiconductor element 36) following thereto; i.e., C<A−B. In this regard, the maximum displacement B is smaller than the maximum displacement A.

Accordingly, the guide member 50 is made to move in the same state as shown in FIG. 1.

After the semiconductor element 36 has been mounted to the interior of the accommodation portion 50*a* of the guide member 50, the cover member 32 is away from the socket body 24, whereby the semiconductor element 36 is held in the same state as shown in FIG. 3 described above.

Accordingly, also in this embodiment, the same effect is obtainable as in the first embodiment.

In the above-mentioned third and fourth embodiments, while the cover member 52 or the guide member 50 is formed separately from the socket body 24 and the contact-moving member 28, both of the cover member 52 and the guide member 50 may be formed separately from the socket body 24 and the contact-moving member 28.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A semiconductor device socket comprising:
   a socket body for supporting a proximal end of a contact terminal having a pair of movable contacts selectively brought into contact with a terminal of a semiconductor device and electrically connected thereto;
   a movable contact-moving member disposed in said socket body to be movable thereto and having a pressing portion for moving said pair of movable contacts close to and away from the terminal of said semiconductor device;
   a guide member disposed an accommodation portion of said movable contact-moving member, for guiding the semiconductor device to locate the terminal of the semiconductor device to said pair of movable contacts so that a predetermined gap is defined between an end surface of the semiconductor device and said guide member, and
   a displacement restricting section for limiting the maximum amount of travel of said guide member,
   wherein the predetermined gap is determined in accordance with the difference between the maximum amount of travel of said movable contact-moving member and the maximum displacement of the semiconductor device and said displacement restricting section limits the maximum amount of travel of said guide member within the maximum displacement of the semiconductor device.

2. A semiconductor device socket as claimed in claim 1, wherein said displacement restricting section is formed of posts provided in said socket body and an engaging pin provided at said guiding member, said engaging pin being selectively engaged with the posts.

3. A semiconductor device socket as claimed in claim 1, wherein said guide member is supported in the accommodation portion of said movable contact-moving member to be movable in the moving direction of said pair of movable contacts of the contact terminal.

4. A semiconductor device socket as claimed in claim 1, wherein said guide member is held by a handler of a robot to be movable close to or away from the accommodation portion of said movable contact-moving member.

5. A semiconductor device socket as claimed in claim 1, wherein the predetermined gap is determined to be smaller than the difference between the maximum displacement amount of said movable contact-moving member and the maximum displacement amount of the semiconductor device.

6. A semiconductor device socket as claimed in claim 1, wherein said displacement restricting section is provided on the periphery of said guide member in said socket body.

7. A semiconductor device socket as claimed in claim 6, said displacement restricting section are provided at four positions on the peripheral edge of said guide member in said socket body.

8. A semiconductor device socket as claimed in claim 1, wherein said displacement restricting section is formed of an engaging section of said guide member, and a section being engaged of said movable contact-moving member engageable with the engaging section of said guide member so that the engaging section is movable in the moving direction of said guiding member.

9. A semiconductor device socket as claimed in claim 8, wherein the engaging section of said guide member is a projection portion and the section being engaged of said movable contact-moving member is a recess with which is engaged the projection portion at a predetermined clearance.

* * * * *

UNITED STATES PATENT AND TRADEMARK OFFICE
CERTIFICATE OF CORRECTION

PATENT NO. : 6,976,863 B2
DATED : December 20, 2005
INVENTOR(S) : Masaru Sato

It is certified that error appears in the above-identified patent and that said Letters Patent is hereby corrected as shown below:

<u>Title page,</u>
Item [57], ABSTRACT,
Line 2, "member An" should read -- member. An --.

Signed and Sealed this

Thirtieth Day of May, 2006

JON W. DUDAS
*Director of the United States Patent and Trademark Office*